(12) United States Patent
Brown et al.

(10) Patent No.: US 8,813,580 B2
(45) Date of Patent: Aug. 26, 2014

(54) APPARATUS AND PROCESSES FOR SILICON ON INSULATOR MEMS PRESSURE SENSORS

(75) Inventors: Gregory C. Brown, Chanhassen, MN (US); Curtis Rahn, Plymouth, MN (US)

(73) Assignee: Honeywell International Inc., Morristown, NJ (US)

( * ) Notice: Subject to any disclaimer, the term of this patent is extended or adjusted under 35 U.S.C. 154(b) by 237 days.

(21) Appl. No.: 13/412,264

(22) Filed: Mar. 5, 2012

(65) Prior Publication Data
US 2013/0228022 A1 Sep. 5, 2013

(51) Int. Cl.
*G01L 1/00* (2006.01)

(52) U.S. Cl.
USPC .................................................. 73/862.68

(58) Field of Classification Search
USPC .................................................. 73/862.68
See application file for complete search history.

(56) References Cited

U.S. PATENT DOCUMENTS

| | | | |
|---|---|---|---|
| 6,718,830 B1* | 4/2004 | Johnson | 73/754 |
| 6,773,951 B2* | 8/2004 | Eriksen et al. | 438/53 |
| 6,789,430 B1* | 9/2004 | Yoneda et al. | 73/754 |
| 7,231,828 B2 | 6/2007 | Kurtz et al. | |
| 7,258,018 B2* | 8/2007 | Kurtz et al. | 73/715 |
| 7,451,655 B2 | 11/2008 | Kurtz et al. | |
| 7,527,997 B2* | 5/2009 | Xu et al. | 438/52 |
| 7,775,119 B1* | 8/2010 | Suminto et al. | 73/727 |
| 7,952,154 B2* | 5/2011 | Guo et al. | 257/417 |
| 8,627,559 B2* | 1/2014 | Suminto et al. | 29/595 |
| 2004/0103724 A1* | 6/2004 | Takizawa et al. | 73/754 |
| 2007/0215964 A1* | 9/2007 | Khuri-Yakub et al. | 257/414 |
| 2008/0006092 A1* | 1/2008 | Brida et al. | 73/715 |
| 2009/0120194 A1* | 5/2009 | Rahn et al. | 73/715 |
| 2011/0006382 A1* | 1/2011 | Nakatani | 257/416 |

OTHER PUBLICATIONS

Barlian et al., "Semiconductor Piezoresistance for Microsystems", "Inst Electr Electron Eng Author Manuscript", Mar. 1, 2010, pp. 1-91, Publisher: IEEE.
"High-Temperature Pressure Transducers", 2005, pp. 1-7, Publisher: Solid State Electronics Center.
"Kulite High Temperature Line of Pressure Transducers with High Temperature SOI Electronics", 2009, p. 1, Publisher: www.kulite.com.
Kurtz et al., "Ultra High Temperature, Miniature, SOI Sensors for Extreme Environments", "IMAPS International HiTECH 2004 Conference", May 17, 2004, pp. 1-11, Publisher: Kulite Semiconductor Products, Inc.
Ohme et al., "High Temperature Precision Amplifier", "International conference on High Temperature Electronics", Sep. 2006, pp. 1-7, Publisher: Honeywell International Inc.
Zhao et al.,-"Design and Fabrication of a Piezoresistive Pressure Sensor for Ultra High Temperature Environment", "Journal of Physics: Conference Series 48 downloaded Mar. 1, 2012", 2006, pp. 178-183, Publisher: Institute of Physics Publishing.

* cited by examiner

*Primary Examiner* — Freddie Kirkland, III
(74) *Attorney, Agent, or Firm* — Fogg & Powers LLC (57) ABSTRACT

System and methods for silicon on insulator MEMS pressure sensors are provided. In one embodiment, a method comprises: applying a doping source to a silicon-on-insulator (SOI) silicon wafer having a sensor layer and an insulating layer comprising $SiO_2$ material; doping the silicon wafer with Boron atoms from the doping source while controlling an injection energy of the doping to achieve a top-heavy ion penetration profile; and applying a heat source to diffuse the Boron atoms throughout the sensor layer of the SOI silicon wafer.

20 Claims, 10 Drawing Sheets

APPARATUS AND PROCESSES FOR SILICON ON INSULATOR MEMS PRESSURE SENSORS

BACKGROUND

Silicon Micro-electromechanical Systems (MEMS) pressure sensors, using Wheatstone bridges formed by piezoresistive resistance elements, are common in the marketplace. Many of these Silicon pressure sensors use Silicon on Insulator (SOI) technology, which utilizes a thin layer of $SiO_2$ (often referred to as a Silica glass) to isolate a substrate from the piezoresistive resistance elements. While this allows operation at temperatures up to 300 C for MEMS based piezoresistive silicon pressure sensors, high accuracy performance is limited by mechanical interaction between the $SiO_2$ layer and the silicon pressure sensor diaphragm. Specifically, long term stability and high accuracy for high pressure sensors that operate above 150 C at >10 KSI are problematic due to non-correctable drifts in sensor output caused by subjecting the $SiO_2$ layer to high pressures under high temperature conditions.

For the reasons stated above and for other reasons stated below which will become apparent to those skilled in the art upon reading and understanding the specification, there is a need in the art for systems and methods that address the $SiO_2$ layer's impact on performance and stability at high temperatures and high pressures.

SUMMARY

The Embodiments of the present invention provide methods and systems that address the $SiO_2$ layer's impact on performance and stability at high temperatures and high pressures and will be understood by reading and studying the following specification.

System and methods for silicon on insulator MEMS pressure sensors are provided. In one embodiment, a method comprises: applying a doping source to a silicon-on-insulator (SOI) silicon wafer having a sensor layer and an insulating layer comprising $SiO_2$ material; doping the silicon wafer with Boron atoms from the doping source while controlling an injection energy of the doping to achieve a top-heavy ion penetration profile; and applying a heat source to diffuse the Boron atoms throughout the sensor layer of the SOI silicon wafer.

DRAWINGS

Embodiments of the present invention can be more easily understood and further advantages and uses thereof more readily apparent, when considered in view of the description of the preferred embodiments and the following figures in which.

In accordance with common practice, the various described features are not drawn to scale but are drawn to emphasize features relevant to the present invention. Reference characters denote like elements throughout figures and text.

DETAILED DESCRIPTION

In the following detailed description, reference is made to the accompanying drawings that form a part hereof, and in which is shown by way of specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

Embodiments of the present invention address two different error mechanisms that result in drift errors from operating Micro-electro-mechanical systems (MEMS) Silicon on Insulator (SOI) pressure sensors under high temperature/high pressure conditions. The first error mechanism involves ion migration that occurs in the $SiO_2$ material of the $SiO_2$ layer when the sensor's pressure sensing diagraph is flexed. The second error mechanism results from micro yielding within the $SiO_2$ layer when the sensor's pressure sensing diagraph is flexed.

Figure 1:
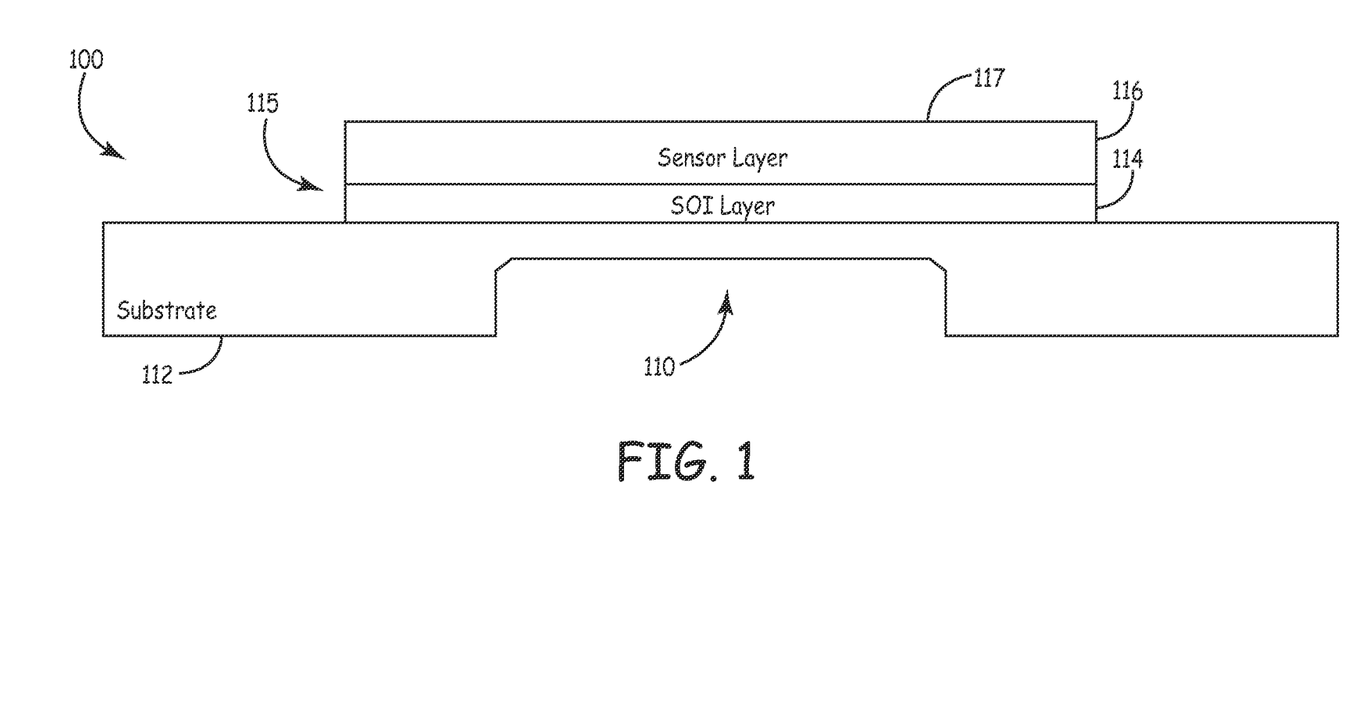
FIG. 1 is a diagram that illustrates an SOI pressure sensor die of one embodiment of the present invention.

FIG. 1 illustrates one embodiment of a SOI pressure sensor die 100. SOI pressure sensor die 100 comprises a silicon substrate 112, an SOI layer 114 (that is, a layer of $SiO_2$ material) and a sensor layer 116 from which one or more piezoresistor elements will be formed, as described below. A cavity 110 formed within substrate 112 results in a thinned region of the substrate (shown generally at 111) located beneath the sensor layer 116 and SOI layer 114. This thinned region 111 functions to form a pressure sensing diagraph that deflects as a function of changes in pressure applied to it.

The structure of SOI pressure sensor die 100 addresses ion migration within the SOI layer 114 by specifying an ion doping profile in sensor layer 116 that limits the penetration of ions introduced into SOI layer 114. This is explained in greater detail in the paragraphs below by reference to FIGS. 2A-2C.

Figure 2A:
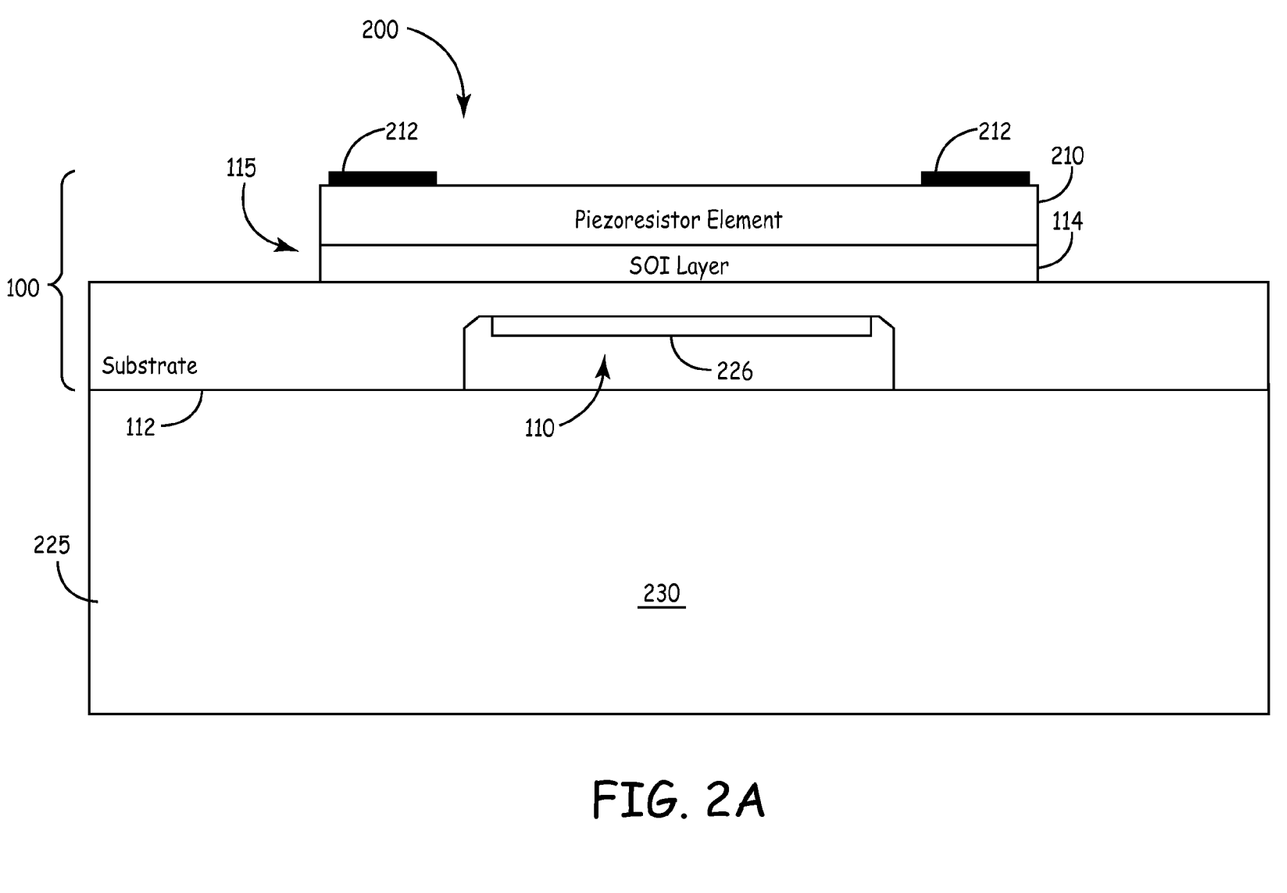
FIGS. 2A-2C are diagrams that illustrate a pressure sensor of one embodiment of the present invention.
Figure 2B:
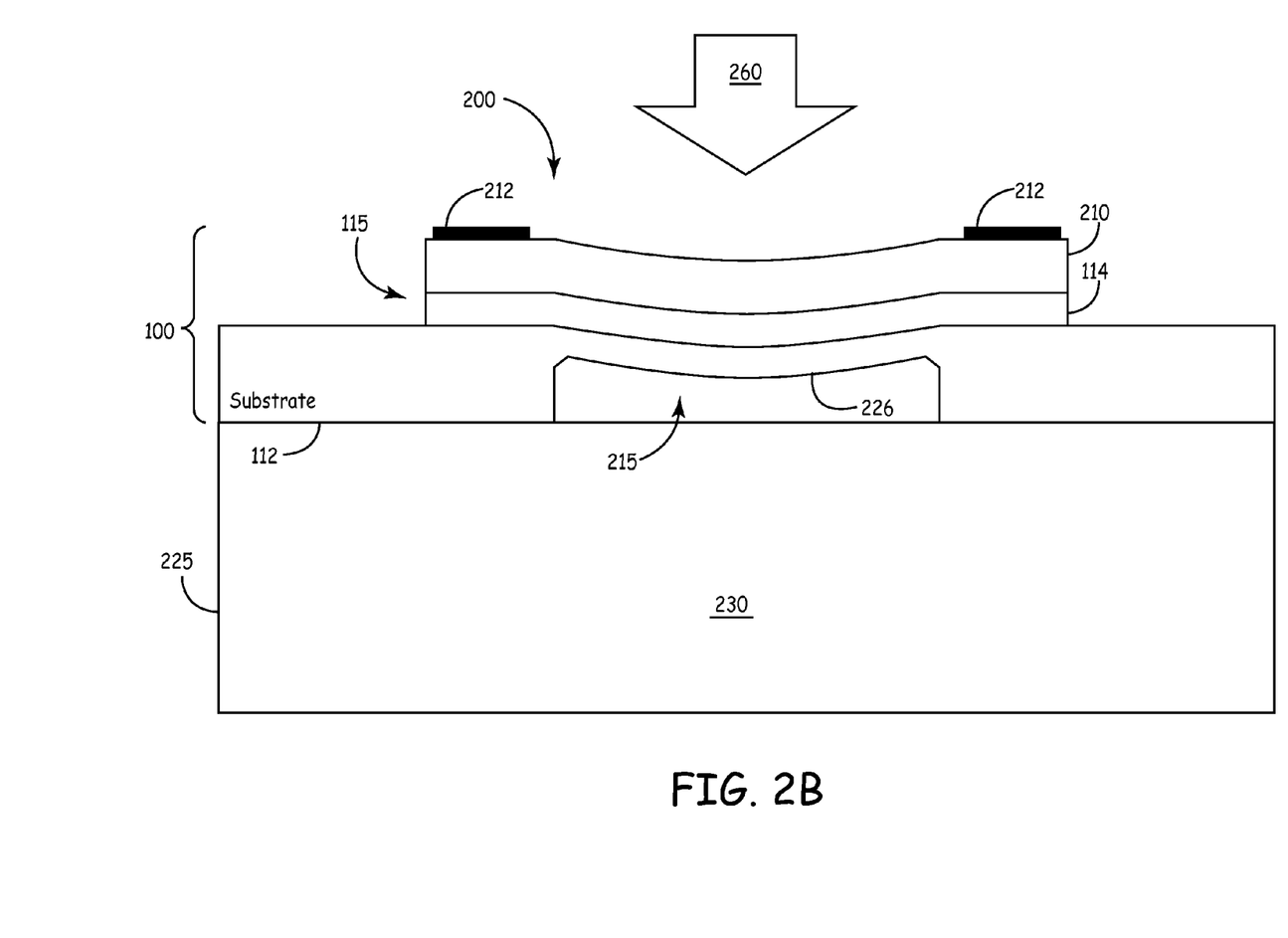

FIG. 2A illustrates one embodiment of a pressure sensor 200 comprising an SOI pressure sensor die 100 mounted onto a pedestal 225. The cavity 110 of SOI pressure sensor die 100 is oriented onto pedestal 225 such that its pressure sensing diaphragm 210 is in pressure communication with a back-filled volume 230 within pedestal 225. In one embodiment, volume 230 provides a backfill pressure (using an inert gas, for example) against pressure sensing diaphragm 210 that determines the zero state for sensor 200. During fabrication of SOI pressure sensor die 100, piezoresistor elements 210 are formed by doping boron atoms into sensor layer 116, resulting in a P++ epitaxial layer. Parts of this layer are etched away and metalized to leave piezoresistor elements 210 and traces for metalized interconnects 212. As illustrated in FIG. 2B, in operation, in response to a positive pressure 260 applied to SOI pressure sensor die 100, pressure sensing diaphragm 210 (including piezoresistor elements 210 and SOI layer 114) flexes inwards into volume 230 (as shown at 215). Because the resistance of piezoresistor elements 210 change as a function of this distortion, changes in this resistance are electrically sensed to provide a measurement of pressure 260.

Figure 2C:
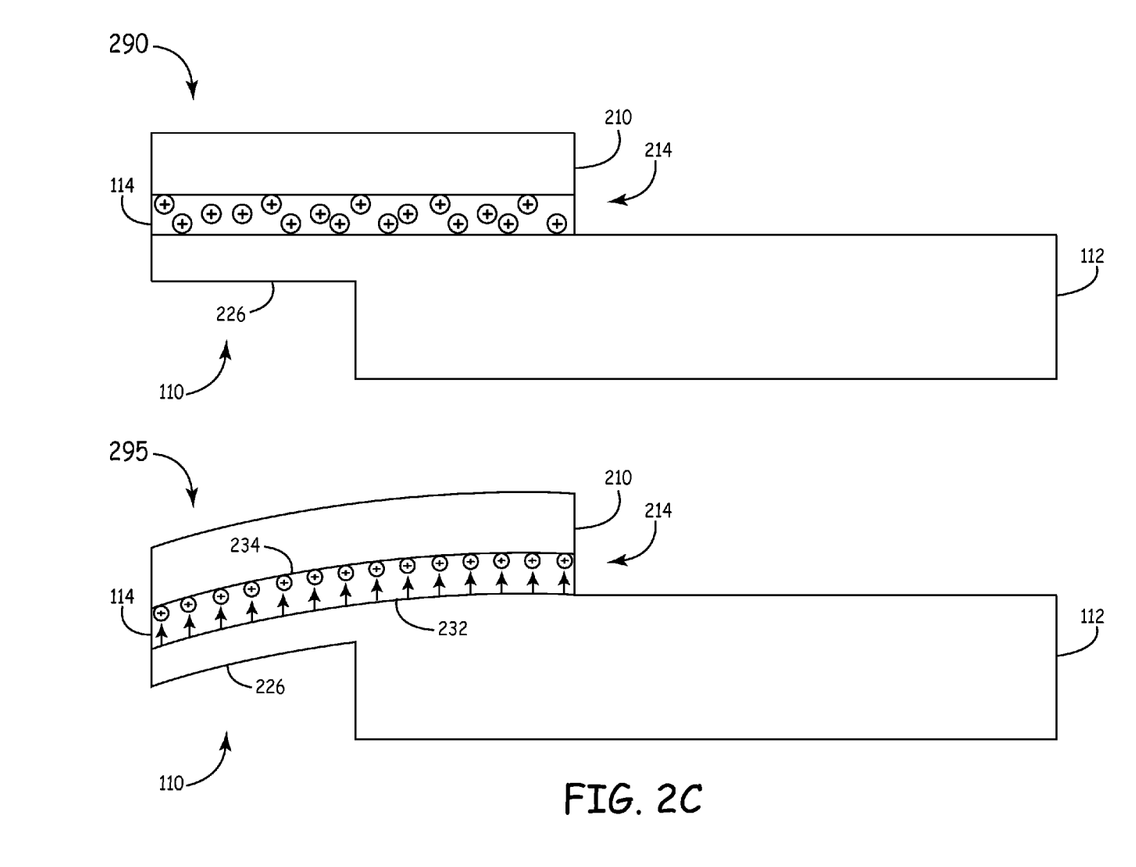

As would be appreciated by one of ordinary skill in the art upon reading this specification, the sensitivity of a piezoresistor element is optimized by providing a high level of doping uniformly throughout the sensor layer 116 thickness. The levels of doping energy and temperature exposures needed to obtain this doping uniformity, however, result in over driving boron atoms though the silicon/oxide interface and into the SOI layer 114. These atoms, which may be ionic in nature, in the SOI layer 114 are therefore available to redistribute themselves during applied pressure due to the diaphragm 210 surface tension strains or to produce trap sites at the interface which may be strain activated. That is, starting with a SOI layer 114 of $SiO_2$ that includes ions, we can assume that those ions initially are randomly distributed throughout the SOI layer 114. During stress and strain of SOI layer 114, these ions move from areas of compression to areas of tension. This phenomenon is illustrated in FIG. 2C. Shown generally at 290, is a portion of SOI pressure sensor 200 at rest with no pressure acting on pressure sensing diaphragm 210. Ions 214 (i.e., boron atoms) within SOI layer 114 are randomly distributed. Shown generally at 295, as pressure sensing diaphragm 210 deflects into cavity 110 in response to an applied pressure, ions 214 will migrate within SOI layer 114 away from areas of compression (such as shown at 232, for example) towards areas of tensions (such as shown at 234, for example). The ion movement rate is exponential with temperature. The result is that this effect is larger at higher temperatures.

When ion movement is sufficient, it will change the geometry of SOI layer 114 so that after an applied pressure stimulus is removed, the diaphragm does not immediately return to the initial shape it had at mechanical zero. This distortion in the shape of SOI layer 114 from mechanical zero would be sensed as a change in strain by piezoresistor elements 210 resulting in a drift error in the measurement output from sensor 200. Further, as the ions slowly redistribute back to a random concentration within SOI layer 114, the ongoing change in shape of diaphragm 210 will be sensed by piezoresistor elements 210 as changes in measured pressure and thus introducing a dynamically changing drift error.

SOI pressure sensor die 100 avoids these errors due to ion migration by controlling the concentration of boron atoms injected into SOI layer 114 during doping of sensor layer 116. By minimizing the concentration of boron atoms injected into SOI layer 114, the number of ions is greatly reduced, minimizing the instability caused by ions moving due to strain fields as well as any trap sites at the interface or in the oxide. As explained with respect to FIGS. 3 and 4A, 4B below, this is achieved by a doping and diffusing process that results in piezoresistor elements 210 having a doping profile characterized as a top-heavy ion penetration profile.

Figure 3:
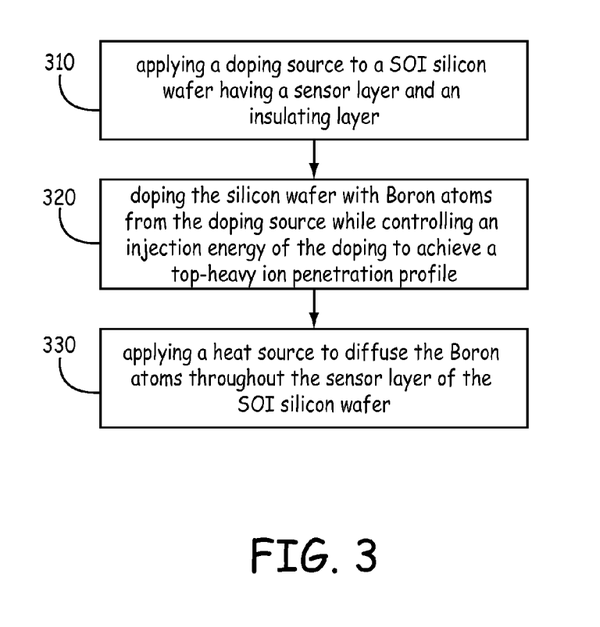
FIG. 3 is a flow chart that illustrates a process of one embodiment of the present invention.
Figure 4A:
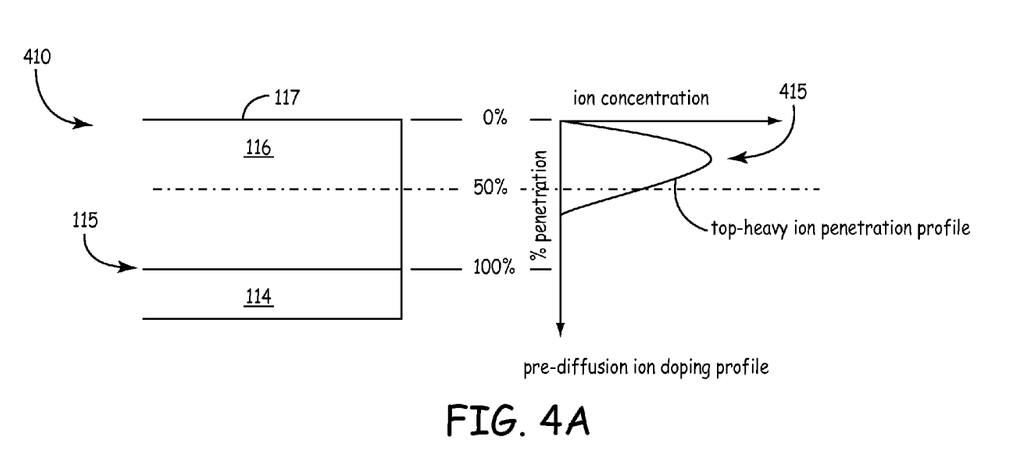
FIGS. 4A and 4B are diagrams illustrating ion doping profiles of one embodiment of the present invention.
Figure 4B:
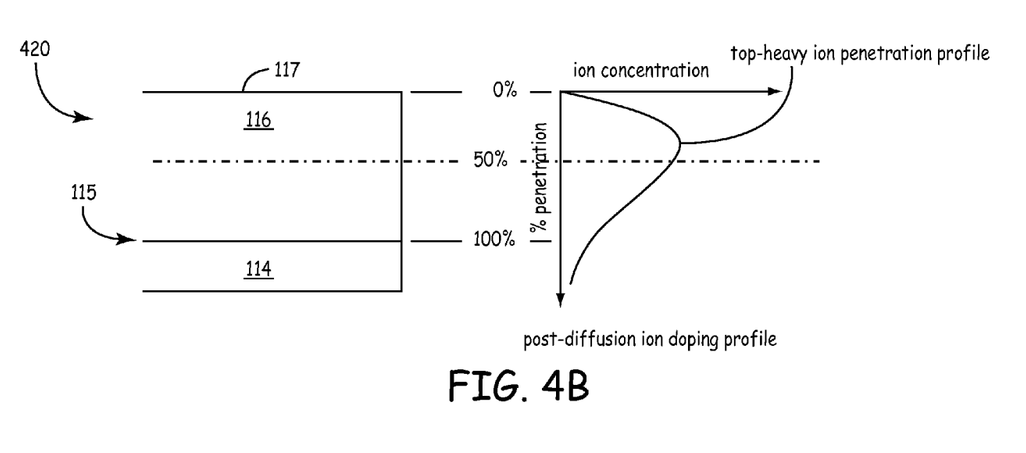

The method begins at 310 with applying a doping source to a SOI silicon wafer having a sensor layer and an insulating layer. For example, in one embodiment, the process performed at block 310 comprises applying the doping source across the top surface 117 of SOI pressure die 100. The method proceeds to 320 with doping the silicon wafer with Boron atoms from the doping source while controlling an injection energy of the doping to achieve a top-heavy ion penetration profile. In one implementation, blocks 310 and 320 are performed within a standard doping furnace. As the term is defined herein, a top-heavy ion penetration profile means that a peak in the concentration of Boron atoms occurs at a depth of less than 50% into the Silicon sensor layer as referenced from the surface where the doping source is applied. FIG. 4A illustrates generally at 410 an example of doping profile characterizes as a top-heavy ion penetration profile. That means, for this doping profile, the peak in ion concentration (shown at 415) occurs at a depth of less than 50% penetration into sensor layer 116 from surface 117. In some alternate embodiments, after block 320 is performed, the concentration of Boron atoms comprises a top-heavy ion penetration profile that peaks at a penetration between 33%-40%. The method next proceeds to 330 with applying a heat source to diffuse the Boron atoms throughout the sensor layer of the SOI silicon wafer. Although the diffusion step of at block 330 will function to flatten out the distribution of Boron atoms, the duration of diffusion may be controlled so that a top-heavy ion penetration profile is maintained after diffusion as shown in FIG. 4B. This process will result in a gradient of resistance across the piezoresitor elements formed from the sensor layer, which may produce a device having less sensitivity than one with a uniform resistance distribution. However, in exchange for potentially giving up some sensitivity, the resulting sensor is significantly less susceptible to measurement drifts caused by ion migration in the $SiO_2$ of the SOI layer and to trap generation caused by the presence of boron.

Figure 5A:
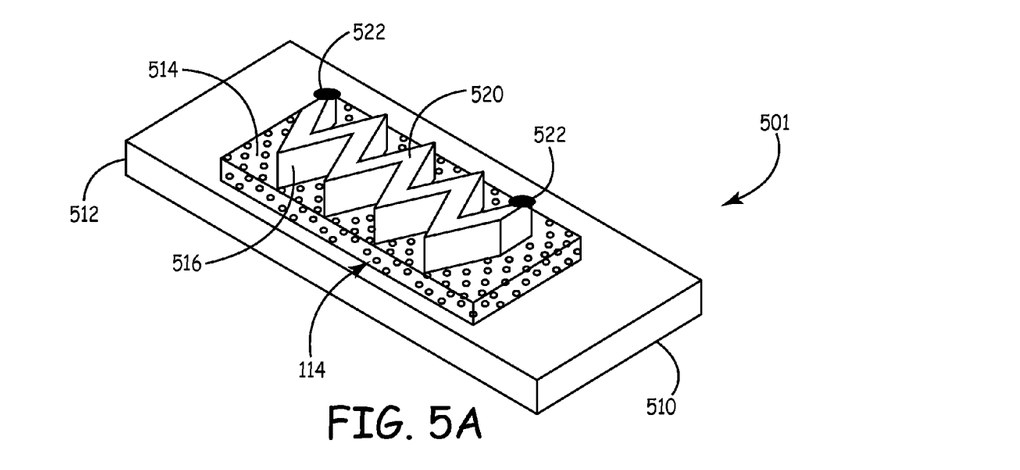
FIGS. 5A and 5B are diagrams illustrating an SOI pressure sensor die of one embodiment of the present invention.
Figure 5B:
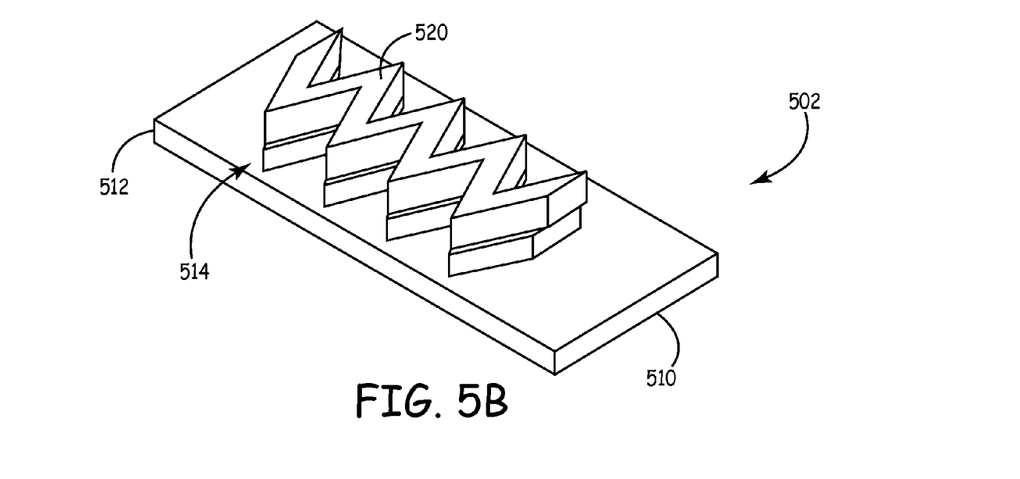

FIGS. 5A and 5B illustrates another embodiment of the present invention that addresses drift errors caused by micro yielding within the $SiO_2$ layer.

Figure 5C:
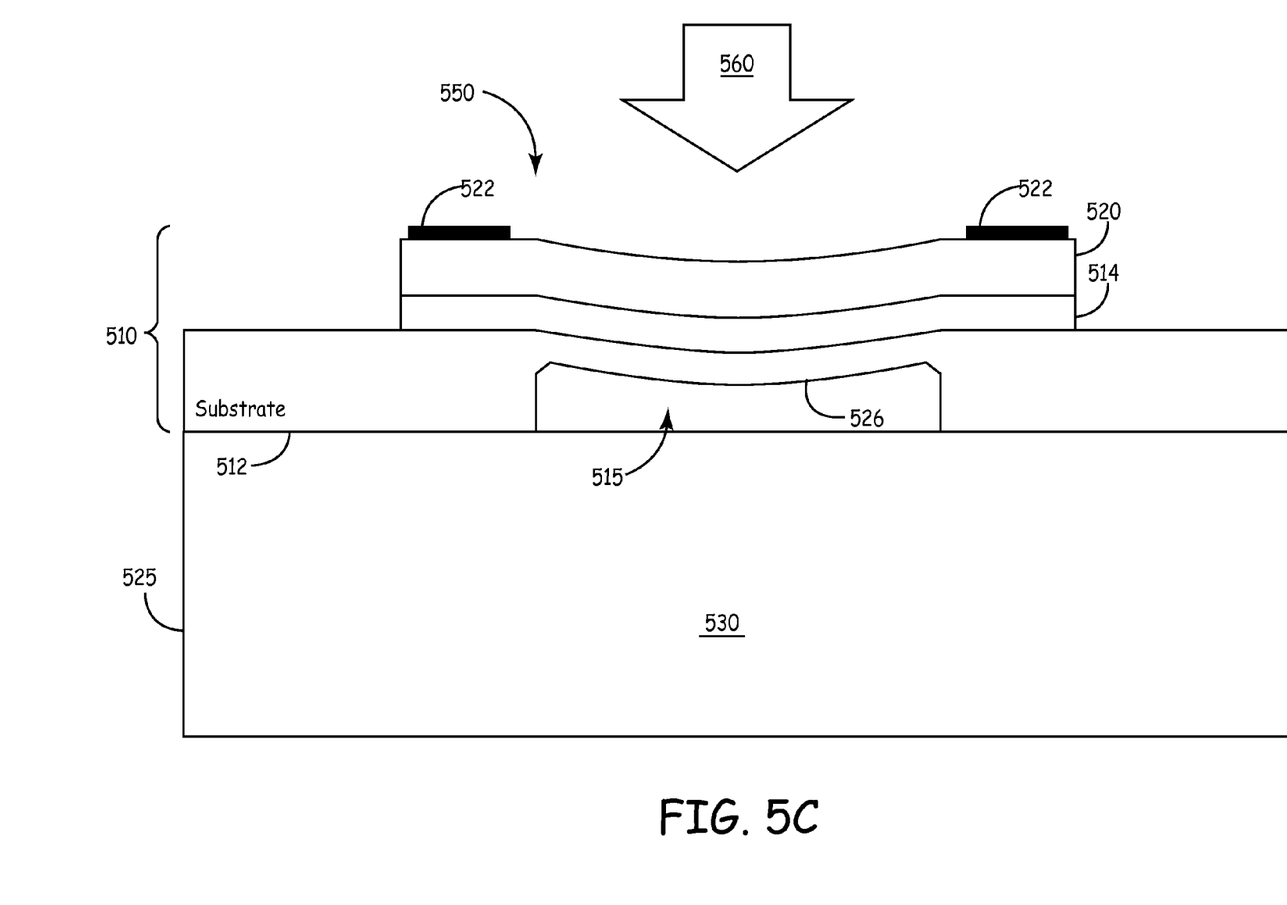
FIG. 5C is a diagram illustrating a pressure sensor of one embodiment of the present invention.

FIGS. 5A and 5B shows an SOI sensor die 510 comprising a substrate 512, an SOI layer 514 of $SiO_2$ and a silicon sensor layer 516 (such as die 100 describe above). FIG. 5C illustrates one embodiment of a pressure sensor 550 comprising an SOI pressure sensor die 510 mounted onto a pedestal 525. The cavity 515 of SOI pressure sensor die 510 is oriented onto pedestal 525 such that its pressure sensing diaphragm 526 is in pressure communication with a backfilled volume 530 within pedestal 5225. In one embodiment, volume 530 provides a backfill pressure (using an inert gas, for example) against pressure sensing diaphragm 526 that determines the zero state for sensor 550. As illustrated in FIG. 5C, in operation, in response to a positive pressure 560 applied to SOI pressure sensor die 510, pressure sensing diaphragm 526 (including piezoresistor elements 520 and SOI layer 514) flexes inwards into volume 530 (as shown at 515). Because the resistance of piezoresistor elements 520 change as a function of this distortion, changes in this resistance are electrically sensed to provide a measurement of pressure 560.

During fabrication of piezoresistor elements 520, parts of sensor layer 516 are etched away leaving piezoresistor element 520 and traces for metalized interconnects 522. As illustrated in FIG. 5A, where sensor layer 516 has been removed, the surface of the die is largely the exposed $SiO_2$ of the SOI layer 514. At moderate temps, up to about 150 C, the $SiO_2$ of the exposed SOI layer 514 behaves as a brittle material with little hysteresis or yielding. As the temp is increase the $SiO_2$ of the SOI layer 514 takes on the characteristics of a more ductile material. When die 510 begins to deflect from a pressure stimulus (such as pressure 560 shown with respect to FIG. 5C), high tensile stress occurs in the $SiO_2$ of the SOI layer 514. For example, in one sensor embodiment, the stresses can reach 60 KSI at a 20 KSI pressure. At temperatures above 150 C the exposed areas of $SiO_2$ will start to micro yield causing the die's diaphragm to change its mechanical zero point. This distortion is sensed as a change in strain by piezoresistor elements 520 resulting in a drift error in pressure measurement output. This micro yielding is somewhat reversible. For example, when the applied pressure is removed (e.g., returns to atmospheric pressure) and temperatures remain above 150 C, the micro yielding is gradually reversed until the original mechanical zero is reached. However, this reversal process can take weeks to complete. Further, as the micro yielding is gradually reversed within SOI layer 514, the ongoing change in shape of die 510's diaphragm 526 is sensed by piezoresistor elements 520 as a change in measured pressure that does not correspond to any actual change in pressure. Thus, the reversal process itself introduces a dynamically changing drift error.

FIG. 5B illustrates the further etching performed to address this source of measurement drift error. After the initial etching to form piezoresistor element 520 and traces for metalized interconnects 522, die 500 is etched again, this time to remove portions of $SiO_2$ from the SOI layer. For example, in one embodiment, shown in FIG. 5B, the $SiO_2$ material is removed except for those portions not supporting piezoresistor element 520 and traces for metalized interconnects 522. This removes the SOI layer from the high tensile stress areas of the die so that non-repeatability due to micro yielding is eliminated. That is, where the SOI layer has been eliminated, micro yielding caused distortion of $SiO_2$ material cannot occur, structurally removing this source of drift error from the SOI sensor die 510. As further shown in FIG. 5B, in one embodiment, the SOI layer can be etched to a pattern conforming to the piezoresitance elements. That is, portions of the SOI layer not directly support the piezoresitance element are removed to that the pattern of remaining SOI layer 514 material matches the pattern of remaining sensor level 516 material.

Figure 6:
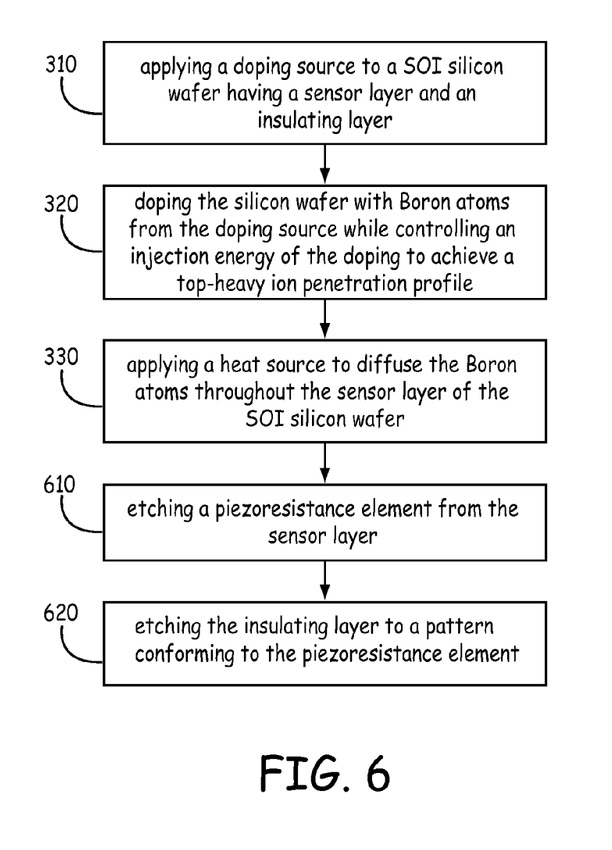
FIG. 6 is a flow chart that illustrates a process of one embodiment of the present invention.

As would be appreciated by one of ordinary skill in the art upon reading this specification, any of the techniques described above for addressing measurement drift errors cause by deformation of SOI layer at high temperatures and pressures can used either individually within embodiments of the present invention or combined and used in conjunction in still other embodiments. For example, in one embodiment, the sensor layer 516 of SOI sensor die 500 is fabricated with a top-heavy ion penetration profile such as described with respect to SOI sensor die 100. As such, the descriptions of various embodiments and their alternatives described herein may be used in various combinations with each other. For example, FIG. 6 illustrates one embodiment where blocks 310, 320 and 330 of the method of FIG. 3 are followed by etching one or more piezoresistance elements from the sensor layer at block 610 and etching the insulating layer to a pattern conforming to the piezoresistance elements at block 620.

Figure 7:
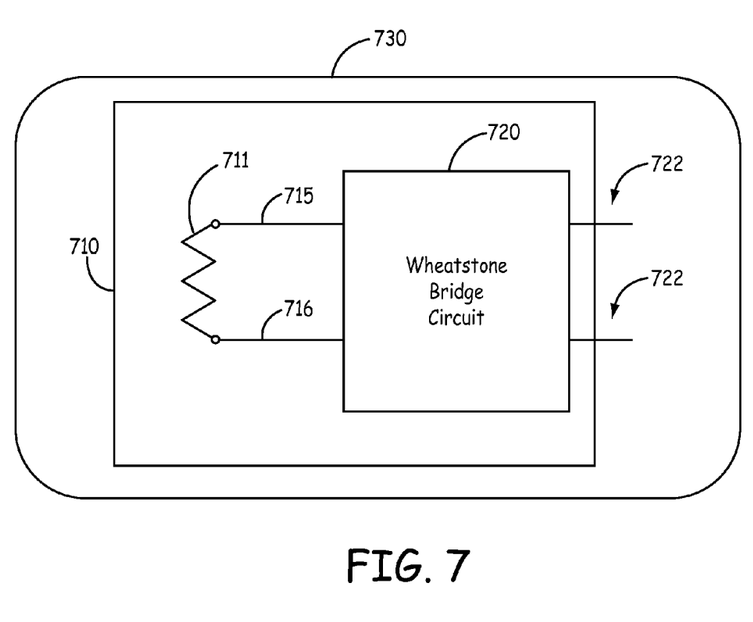
FIG. 7 is a diagram illustrating one embodiment of the present invention.

FIG. 7 illustrates yet another embodiment of a SOT pressure sensor device 730 comprising a SOI sensor die 710 with one or more piezoresistance elements 711 coupled by leads 715 and 716 to a Wheatstone bridge circuit 720. In one embodiment, Wheatstone bridge circuit 720 provides an electric voltage across piezoresistance elements 711 and outputs a measurement signal 722 that varies as a function of pressure sensed by SOI sensor die 710. In alternate embodiments, SOI sensor die 710 comprises a die such as SOI sensor die 100 (having a top-heavy ion penetration profile), SOI sensor die 510 (having an SOI layer etched to conform with a pattern of the sensor layer), or a combination of both features. Accordingly, the descriptions an alternatives discussed above for those embodiments apply to SOI pressure sensor device 730 as well.

Example Embodiments

Example 1 includes a Silicon-on-insulator (SOI) pressure sensor die, the die comprising a substrate comprising Si material, the substrate having a first surface and an opposing second surface; an SOI layer comprising $Si_2$ material deposited on the first surface; a sensor layer comprising doped Si material deposited on the SOI layer, the SOI layer separating the sensor layer from the substrate; wherein the doped Si material possesses an ion doping profile conforming to a top-heavy ion penetration profile.

Example 2 includes the die of Example 1 wherein the doped Si material is doped with Boron atoms.

Example 3 includes the die of Example 1 or 2, wherein the doped Si material is doped with Boron atom such that a peak concentration of Boron atoms occurs between 33-40% penetration from a top surface of the sensor layer.

Example 4 includes the die of Examples 1, 2 or 3 wherein the doped Si material forms a P++ doped epitaxial layer.

Example 5 includes the die of Examples 1, 2, 3, or 4 wherein the doped sensor layer comprises one or more piezoresistance elements formed from the doped Si material.

Example 6 includes the die of Examples 1, 2, 3, 4 or 5 further including a Wheatstone bridge circuit formed on the substrate and electrically coupled to the one or more piezoresistance elements.

Example 7 includes the die of Examples 5 or 6 wherein the SOI layer is patterned to conform to a pattern of the one or more piezoresistance elements formed from the doped Si material.

Example 8 includes the die of Example 7, further including a Wheatstone bridge circuit coupled to the one or more piezoresistance elements.

Example 9 includes the die of any of Examples 1-8 wherein the second surface of the substrate is mounted to a pedestal having a sealed volume having a backfill pressure; the substrate further comprising a cavity formed in the second surface of the substrate, wherein the one or more piezoresistance elements are aligned with the cavity to define a pressure sensing diaphragm and the pressure sensing diaphragm is in pressure communication with the sealed volume.

Example 10 includes a Silicon-on-insulator (SOI) pressure sensor die, the die comprising a substrate comprising Si material, the substrate having a first surface and an opposing second surface; an SOI layer comprising $SiO_2$ material deposited on the first surface; a sensor layer comprising doped Si material deposited on the SOI layer, the SOI layer separating the sensor layer from the substrate; wherein the SOI layer is etched into a pattern conforming to a pattern of the sensor layer.

Example 11 includes the die of Example 10 wherein the second surface of the substrate is mounted to a pedestal having a sealed volume having a backfill pressure, the substrate further comprising a cavity formed in the second surface of the substrate, wherein one or more piezoresistance elements are aligned with the cavity to define a pressure sensing diaphragm and the pressure sensing diaphragm is in pressure communication with the sealed volume.

Example 12 includes the die of any of Examples 10-11 wherein the doped Si material is doped with Boron atoms and comprises a doping profile conforming to a top-heavy ion penetration profile.

Example 13 includes the die of Example 12 wherein the doped Si material is doped with Boron atoms such that a peak concentration of Boron atoms occurs between 33-40% penetration from a top surface of the sensor layer.

Example 14 includes the die of any of Examples 10-13 wherein the doped Si material forms a P++ doped epitaxial layer.

Example 15 includes the die of any of Examples 10-14 wherein the sensor layer comprises one or more piezoresistance elements formed from the doped Si material.

Example 16 includes the die of any of Examples 11 and 15 further comprising a Wheatstone bridge circuit formed on the substrate and electrically coupled to the one or more piezoresistance elements Example 17 includes a method for applying a doping source to a silicon-on-insulator (SOI) silicon wafer having a sensor layer and an insulating layer comprising $SiO_2$ material; doping the silicon wafer with Boron atoms from the doping source while controlling an injection energy of the doping to achieve a top-heavy ion penetration profile; and applying a heat source to diffuse the Boron atoms throughout the sensor layer of the SOI silicon wafer.

Example 18 includes the method of Example 17 further including etching one or more piezoresistance elements from the sensor layer.

Example 19 includes the method of Example 18 further including etching a Wheatstone bridge circuit from the sensor layer, the Wheatstone bridge circuit coupled to the one or more piezoresistance elements.

In Example 20 includes the method of Examples 18 or 19 further including etching the insulating layer to a pattern conforming to the one or more piezoresistance elements.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A Silicon-on-insulator (SOI) pressure sensor die, the die comprising:
    a substrate comprising Si material, the substrate having a first surface and an opposing second surface;
    an SOI layer comprising $SiO_2$ material deposited on the first surface;
    a sensor layer comprising doped Si material deposited on the SOI layer, the SOI layer separating the sensor layer from the substrate;
    wherein the doped Si material possesses an ion doping profile conforming to a top-heavy ion penetration profile having a peak concentration of doping atoms occurring at a depth of less than 50% into the sensor layer.

2. The die of claim 1, wherein the doped Si material is doped with Boron atoms.

3. The die of claim 1, wherein the doped Si material is doped with Boron atom such that a peak concentration of Boron atoms occurs between 33-40% penetration from a top surface of the sensor layer.

4. The die of claim 1, wherein the doped Si material forms a P++ doped epitaxial layer.

5. The die of claim 1, wherein the doped sensor layer comprises one or more piezoresistance elements formed from the doped Si material.

6. The die of claim 5, further comprising a Wheatstone bridge circuit formed on the substrate and electrically coupled to the one or more piezoresistance elements.

7. The die of claim 5, wherein the SOI layer is patterned to conform to a pattern of the one or more piezoresistance elements formed from the doped Si material.

8. The die of claim 7, further comprising a Wheatstone bridge circuit coupled to the one or more piezoresistance elements.

9. The die of claim 1, wherein the second surface of the substrate is mounted to a pedestal having a sealed volume having a backfill pressure;
    the substrate further comprising a cavity formed in the second surface of the substrate, wherein the one or more piezoresistance elements are aligned with the cavity to define a pressure sensing diaphragm and the pressure sensing diaphragm is in pressure communication with the sealed volume.

10. A Silicon-on-insulator (SOI) pressure sensor die, the die comprising:
    a substrate comprising Si material, the substrate having a first surface and an opposing second surface;
    an SOI layer comprising $SiO_2$ material deposited on the first surface;
    a sensor layer comprising doped Si material deposited on the SOI layer, the SOI layer separating the sensor layer from the substrate;
    wherein the SOI layer is etched into a pattern conforming to a pattern of the sensor layer.

11. The die of claim 10, wherein the second surface of the substrate is mounted to a pedestal having a sealed volume having a backfill pressure,
    the substrate further comprising a cavity formed in the second surface of the substrate, wherein one or more piezoresistance elements are aligned with the cavity to define a pressure sensing diaphragm and the pressure sensing diaphragm is in pressure communication with the sealed volume.

12. The die of claim 11, further comprising a Wheatstone bridge circuit formed on the substrate and electrically coupled to the one or more piezoresistance elements.

13. The die of claim 10, wherein the doped Si material is doped with Boron atoms and comprises a doping profile conforming to a top-heavy ion penetration profile having a peak concentration of doping atoms occurring at a depth of less than 50% into the sensor layer.

14. The die of claim 13, wherein the doped Si material is doped with Boron atom such that a peak concentration of Boron atoms occurs between 33-40% penetration from a top surface of the sensor layer.

15. The die of claim 10, wherein the doped Si material forms a P++ doped epitaxial layer.

16. The die of claim 10, wherein the sensor layer comprises one or more piezoresistance elements formed from the doped Si material.

17. A method comprising:
    applying a doping source to a silicon-on-insulator (SOI) silicon wafer having a sensor layer and an insulating layer comprising $SiO_2$ material;
    doping the silicon wafer with Boron atoms from the doping source while controlling an injection energy of the doping to achieve a top-heavy ion penetration profile having a peak concentration of doping atoms occurring at a depth of less than 50% into the sensor layer; and
    applying a heat source to diffuse the Boron atoms throughout the sensor layer of the SOI silicon wafer.

18. The method of claim 17, further comprising etching one or more piezoresistance elements from the sensor layer.

19. The method of claim 18, further comprising:
    etching a Wheatstone bridge circuit from the sensor layer, the Wheatstone bridge circuit coupled to the one or more piezoresistance elements.

20. The method of claim 17, further comprising:
    etching the insulating layer to a pattern conforming to the one or more piezoresistance elements.

* * * * *